(12) United States Patent
Nishida et al.

(10) Patent No.: US 8,670,656 B2
(45) Date of Patent: Mar. 11, 2014

(54) LIQUID HEATING UNIT, LIQUID PROCESSING APPARATUS INCLUDING THE SAME, AND LIQUID PROCESSING METHOD

(75) Inventors: Toshihiko Nishida, Koshi (JP); Kazuyoshi Eshima, Koshi (JP); Hisakazu Nakayama, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 308 days.

(21) Appl. No.: 13/217,080

(22) Filed: Aug. 24, 2011

(65) Prior Publication Data
US 2012/0063754 A1 Mar. 15, 2012

(30) Foreign Application Priority Data
Sep. 13, 2010 (JP) ................................. 2010-204053

(51) Int. Cl.
*F24H 1/16* (2006.01)
*H05B 3/42* (2006.01)

(52) U.S. Cl.
USPC .......................................... 392/483; 392/424

(58) Field of Classification Search
None
See application file for complete search history.

(56) References Cited

U.S. PATENT DOCUMENTS

| | | | | | |
|---|---|---|---|---|---|
| 1,162,537 | A | * | 11/1915 | Yager ............................ | 392/481 |
| 1,408,634 | A | * | 3/1922 | Passmore et al. ............. | 392/308 |
| 1,482,574 | A | * | 2/1924 | Meyer ........................... | 219/208 |
| 1,489,444 | A | * | 4/1924 | Kestler .......................... | 138/33 |
| 1,534,898 | A | * | 4/1925 | Bluemlein ..................... | 392/481 |
| 1,595,819 | A | * | 8/1926 | Bluemlein ..................... | 392/481 |
| 1,608,537 | A | * | 11/1926 | Swanberg .............. | 123/142.5 E |
| 1,615,166 | A | * | 1/1927 | Cowles .......................... | 392/481 |
| 1,670,032 | A | * | 5/1928 | Gibbons ........................ | 392/481 |
| 1,684,845 | A | * | 9/1928 | Parker et al. .................. | 219/208 |
| 1,716,996 | A | * | 6/1929 | Adam ............................ | 392/481 |
| 2,048,104 | A | * | 7/1936 | Clinefelter .................... | 392/496 |
| 2,460,691 | A | * | 2/1949 | Godshall ....................... | 392/481 |

(Continued)

FOREIGN PATENT DOCUMENTS

| | | |
|---|---|---|
| JP | 10-024102 A | 1/1998 |
| JP | 2000-271549 A | 10/2000 |

(Continued)

*Primary Examiner* — Joseph M Pelham
(74) *Attorney, Agent, or Firm* — Abelman, Frayne & Schwab

(57) ABSTRACT

Disclosed are a liquid heating unit capable of monitoring the temperature of the liquid storage tank or pipe in which liquid is heated by transmission of the radiated light, a liquid processing apparatus including the same, and a liquid processing method. The liquid heating unit includes: a lamp heater radiating light; a cylindrical member made of material transmitting the radiated light and having a cylindrical shape in which the lamp heater is able to be inserted and penetrated into an internal space thereof; a liquid pipe placed along an outer periphery of the cylindrical member and configured to heat liquid flowing therein using the radiated light; a reflection plate that covers the liquid pipe from the outside and reflects the radiated light; and a first temperature sensor attached to an outer surface of the reflection plate.

14 Claims, 5 Drawing Sheets

(56) References Cited

U.S. PATENT DOCUMENTS

| | | | | |
|---|---|---|---|---|
| 2,472,713 | A | * | 6/1949 | Lijoi .............................. 392/481 |
| 2,611,585 | A | * | 9/1952 | Boling ........................... 165/164 |
| 2,791,204 | A | * | 5/1957 | Andrus ........................... 122/33 |
| 2,866,885 | A | * | 12/1958 | McIlrath ....................... 392/481 |
| 2,987,605 | A | * | 6/1961 | Brandl .......................... 392/496 |
| 3,122,014 | A | * | 2/1964 | Dobbins ........................ 96/101 |
| 3,737,626 | A | * | 6/1973 | Davis et al. ................... 392/484 |
| 5,214,740 | A | * | 5/1993 | Carroll .......................... 392/481 |
| 5,559,924 | A | * | 9/1996 | Kadotani et al. .............. 392/483 |
| 5,590,240 | A | * | 12/1996 | Rezabek ........................ 392/483 |
| 6,577,817 | B2 | * | 6/2003 | Harris ............................ 392/481 |
| 2004/0184794 | A1 | * | 9/2004 | Johnson et al. ................ 392/483 |
| 2012/0275775 | A1 | * | 11/2012 | Iskrenovic .................... 392/483 |

FOREIGN PATENT DOCUMENTS

| | | |
|---|---|---|
| JP | 2000-304353 A | 11/2000 |
| JP | 2003-090613 A | 3/2003 |
| JP | 2003-090614 A | 3/2003 |
| JP | 2003-90614 A | 3/2003 |
| JP | 2004-028938 A | 1/2004 |
| JP | 2007-017098 A | 1/2007 |
| JP | 2008-096057 A | 4/2008 |
| JP | 2009-218405 A | 9/2009 |

* cited by examiner

LIQUID HEATING UNIT, LIQUID PROCESSING APPARATUS INCLUDING THE SAME, AND LIQUID PROCESSING METHOD

CROSS-REFERENCE TO RELATED APPLICATIONS

This application is based on and claims priority from Japanese Patent Application No. 2010-204053, filed on Sep. 13, 2010, with the Japanese Patent Office, the disclosure of which is incorporated herein in its entirety by reference.

TECHNICAL FIELD

The present disclosure relates to a liquid heating unit heating liquid in order to process an object to be processed such as a semiconductor substrate or a substrate for a flat panel display, a liquid processing apparatus including the same, and a liquid processing method.

BACKGROUND

When a semiconductor device and a flat panel display are manufactured, a process of cleaning substrates used for manufacturing thereof is appropriately performed. In the cleaning process, a cleaning liquid is discharged to the substrate and residues adsorbed on the substrate are cleaned by the cleaning liquid. There are many cases where the cleaning liquid is heated in order to improve the cleaning effect and a heating unit for heating the liquid is used for the heating. See, for example, Japanese Patent Application Laid-Open No. 2003-90614.

A liquid heating device disclosed in Japanese Patent Application Laid-Open No. 2003-90614 includes a lamp heater capable of radiationally heating a liquid, such as a mercury lamp or a halogen lamp. The liquid heating device also includes a cylindrical liquid tank made of quartz having light transmittance and chemical resistance and having a hollow portion where the lamp heater is placed. In the liquid tank, an inlet and an outlet are provided for the liquid, and the liquid that flows into the liquid tank from the inlet is heated to a predetermined temperature by the lamp heater placed in the hollow portion and discharged from the outlet to be supplied to a liquid processing apparatus.

SUMMARY

According to an exemplary embodiment of the present disclosure, there is provided a liquid heating unit including: a lamp heater configured to radiate light; a cylindrical member made of material transmitting the having a cylindrical shape in which the lamp heater is able to be inserted and penetrated into an internal space thereof; a liquid pipe placed along an outer periphery of the cylindrical member and configured to heat liquid flowing therein using the radiated light; a reflection plate configured to cover the liquid pipe from the outside and reflect the radiated light; and a first temperature sensor attached to an outer surface of the reflection plate.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
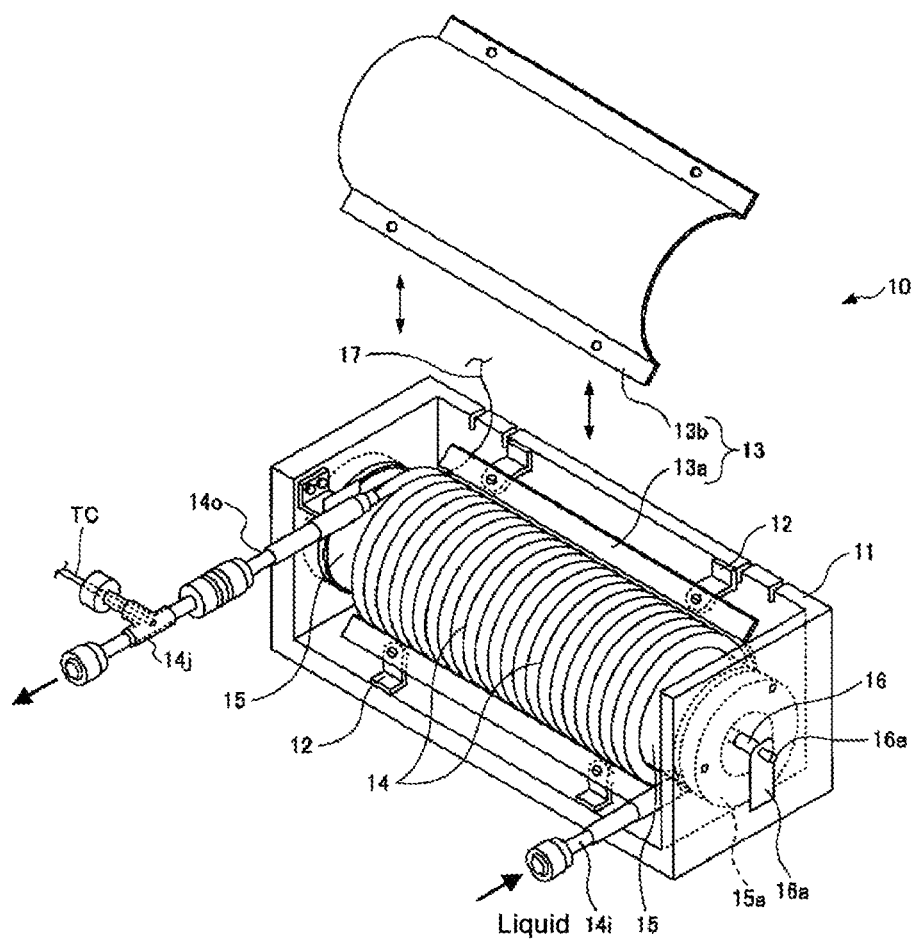
FIG. 1 is a perspective view illustrating a liquid heating unit according to a first exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

In order to heat liquid in a short period of time in a liquid heating unit for heating liquid, a liquid storage tank or a pipe may be made of tetrafluoroethylene perfluoro alkyl vinyl ether copolymer (PFA) having transmittance higher than quartz with respect to radiated light from a halogen lamp. As a result, radiated light that transmits PFA is absorbed in liquid, thereby heating the liquid efficiently. As such, since the radiated light from the halogen lamp transmits PFA, PFA itself is rarely heated to a high temperature by the radiated light. However, when a member near the PFA is heated by the radiated light from the halogen lamp, there is concern that PFA may be heated to a temperature of the melting point or more.

However, since the temperature of a member made of a light transmitting material capable of transmitting the radiated light from the halogen lamp cannot be accurately measured due to the radiated light from the halogen lamp, it is difficult to monitor the temperature of the liquid storage tank or pipe.

The present disclosure has been made in an effort to provide a liquid heating unit capable of monitoring the temperature of the liquid storage tank or pipe in which liquid contained therein is heated by transmission of the radiated light, a liquid processing apparatus including the same, and a liquid processing method.

According to an exemplary embodiment of the present disclosure, there is provided a liquid heating unit including: a lamp heater configured to radiate light; a cylindrical member made of material transmitting the having a cylindrical shape in which the lamp heater is able to be inserted and penetrated into an internal space thereof; a liquid pipe placed along an outer periphery of the cylindrical member and configured to heat the liquid flowing therein using the radiated light; a reflection plate configured to cover the liquid pipe from the outside and reflect the radiated light; and a first temperature sensor attached to an outer surface of the reflection plate.

In the liquid heating unit, the liquid pipe may have the melting point lower than heat resistant temperature of the cylindrical member and transmittance with respect to the radiated light higher than the transmittance of the cylindrical member. And the liquid pipe may be a tube made of tetrafluoroethylene perfluoro alkyl vinyl ether copolymer (PFA), which is wound around the outer periphery of cylindrical member in a spiral shape.

The liquid heating unit may further comprise a temperature controller electrically connected with the first temperature sensor. In particular, the temperature controller generates a signal when the temperature of the reflection plate measured by the first temperature sensor is higher than a predetermined reference temperature.

Further, the liquid heating unit may further comprise a breaker installed on a power supply line supplying electric power to the lamp heater, inputting the signal, and interrupting power supplied to the lamp heater. And the liquid heating unit may further include a second temperature sensor installed in the liquid pipe and configured to measure the temperature of the liquid heated by the radiated light.

According to another exemplary embodiment of the present disclosure, there is provided a liquid processing apparatus including the liquid heating unit as described above; a main supply line connected with the liquid pipe of the liquid heating unit; a supply line branched from the main supply line; and a liquid processing unit connected with the supply line and configured to process an object to be processed using the liquid supplied from the supply line.

The liquid processing apparatus may include a control unit configured to determine whether the temperature of the liquid heated by the liquid heating unit is within the range of a temperature required for processing in the liquid processing unit.

According to still exemplary embodiment of the present disclosure, there is provided a liquid processing apparatus that comprises: a liquid heating unit as described above; a main supply line connected with the liquid pipe of the liquid heating unit; a supply line branched from the main supply line; and a liquid processing unit connected with the supply line and configured to process an object to be processed using the liquid supplied from the supply line. In the liquid processing apparatus, even when the temperature of the reflection plate measured by the first temperature sensor exceeds a predetermined reference temperature and supply of electric power to the lamp heater is interrupted by the breaker, the operation of the liquid processing unit continues when the control unit determines that the temperature of the liquid heated by the liquid heating unit is within the range of a temperature required for processing in the liquid processing unit.

According to still yet another exemplary embodiment of the present disclosure, there is provided a liquid processing method using the liquid heating unit as described above. The method comprises supplying liquid to be used for processing an object to be processed to the liquid heating unit, thereby heating the liquid to a predetermined temperature; measuring the temperature of the liquid heated to the predetermined temperature by the liquid heating unit; supplying the liquid heated to the predetermined temperature by the liquid heating unit to a liquid processing unit for processing the object to be processed The liquid processing method may include continuing the operation of the liquid processing unit when a control unit determines that the temperature of the liquid heated by the liquid heating unit is within a range of temperature required for processing in the liquid processing unit, even though the temperature of the reflection plate measured by the first temperature sensor is higher than a predetermined reference temperature. The method may further comprise interrupting supply of electric power to the lamp heater when the temperature of the reflection plate in the liquid heating unit is higher than the predetermined reference temperature.

The liquid processing method may further comprise: after the interrupting, measuring the temperature of the reflection plate by the first temperature sensor; determining whether the temperature of the reflection plate measured in the measuring step is lower than the predetermined reference temperature; and restarting the supply of the electric power to the lamp heater when it is determined that the temperature of the reflection plate is lower than the predetermined reference temperature in the determining step. The method may further comprise: after the interrupting, measuring the temperature of the reflection plate by the first temperature sensor; a first determining whether the temperature measured in the measuring of the temperature of the reflection plate is equal to or lower than the predetermined reference temperature; a second determining whether the temperature of the liquid heated by the liquid heating unit is equal to or lower than a temperature which is higher than the lower limit value of a range of the temperature required for processing in the liquid processing unit by a predetermined amount of temperature, when it is determined that the temperature measured in the first determining is equal to or lower than the predetermined reference temperature; and restarting the supply of the electrical power to the lamp heater of the liquid heating unit when it is determined that the temperature of the liquid in the second determining is equal to or lower than the higher temperature by the predetermined amount of temperature.

According to the exemplary embodiments of the present disclosure, there are provided a liquid heating unit capable of monitoring the temperature of the liquid storage tank or pipe in which liquid contained therein is heated by transmission of the radiated light, a liquid processing apparatus including the same, and a liquid processing method.

Hereinafter, the non-restrictive exemplary embodiments of the present disclosure will be described with reference to the accompanying drawings. In the drawings, the same or similar members or the constitutional elements indicated by the same or similar reference numerals, and the description for the members or the constitutional elements will be omitted.

First Exemplary Embodiment

Figure 2:
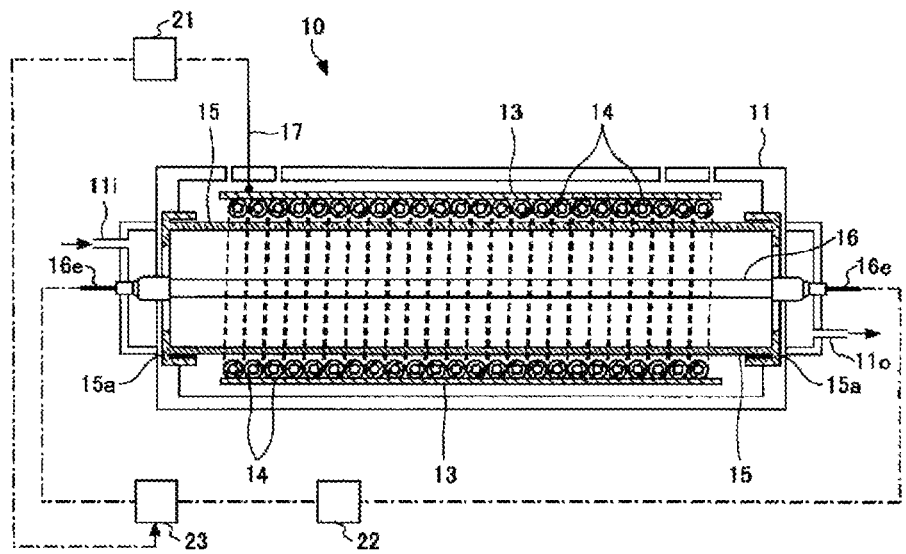
FIG. 2 is a cross-sectional view illustrating the liquid heating unit of FIG. 1.

Referring to FIGS. 1 and 2, a liquid heating unit 10 according to a first exemplary embodiment of the present disclosure includes a case 11, a reflection plate 13 (13a and 13b) held by an attachment jig 12 attached on the inner surface of case 11 and having a substantially cylindrical shape, a tube 14 placed on the inner surface side of reflection plate 13 and wound in a spiral shape, a cylindrical pipe 15 installed inside spiral tube 14, and a lamp heater 16 extending up to the outer surface side of case 11 along substantially a central axis of cylindrical pipe 15.

Case 11 is fabricated by metal such as stainless steel or aluminum and has a substantially rectangular parallelepiped shape (in FIG. 1, an internal structure is shown, thus, two surfaces of case 11 are not shown). Further, a heat insulated structure (not shown) is installed inside of case 11, and as a result, case 11 itself is not excessively heated. Further, each of flange portions 15a is attached to each of a pair of surfaces facing case 11 and cylindrical pipe 15 is held by flange portions 15a. Further, an injection pipe 11i (FIG. 2) of cooling gas is installed at one flange portion 15a and an exhaust pipe 11o (FIG. 2) corresponding to the injection pipe is installed at the other flange portion 15a. The cooling gas (for example, nitrogen gas at an approximately room temperature) may be supplied into cylindrical pipe 15 therethrough. As a result, the temperatures of lamp heater 16 and cylindrical pipe 15 can be prevented from being excessively raised. Further, specifically, cylindrical pipe 15 may be fabricated by quartz.

Spiral tube 14 wound on an outer periphery of cylindrical pipe 15 is fabricated by, for example, tetrafluoroethylene perfluoro alkyl vinyl ether copolymer (PFA). Since PFA has higher transmittance than quartz with respect to radiated light from lamp heater 16, when tube 14 is fabricated by PFA, it is advantageous to heat the liquid that flows therein. Further, tube 14 has an inlet pipe 14*i* and an outlet pipe 14*o* for liquid, and liquid delivered by a pump (not shown) flows into tube 14 from inlet pipe 14*i* and flows out from outlet pipe 14*o*. Further, a 3-way joint 14*j* is installed at outlet pipe 14*o*. A temperature sensor TC is inserted from a direction crossing a flow-out direction of liquid at 3-way joint 14*j* by using an O-ring or a predetermined pipe member, and the temperature of liquid that flows in tube 14 is controlled by temperature measurement using temperature sensor TC. Temperature sensor TC may be a temperature measurement resistor such as a platinum temperature measurement resistor or a thermistor, but preferably a thermocouple.

Liquid may be, for example, isopropyl alcohol (IPA) and deionized water (DIW).

Reflection plate 13 placed to cover the vicinity of tube 14 may be fabricated by, for example, metal such as stainless steel or aluminum. In the exemplary embodiment, for convenience of attachment of tube 14 and cylindrical pipe 15, reflection plate 13 may be separated into a lower reflection plate 13*a* and an upper reflection plate 13*b*, which are integrally attached by an attachment jig 12 to have a cylindrical shape as a whole. Reflection plate 13 reflects the radiated light from lamp heater 16 and contributes to more efficiently heat the liquid that flows in tube 14. The inner surface of reflection plate 13 may be polished as, for example, a mirror-like surface.

Reflection plate 13 is installed to be contacted by or close to tube 14 at the inside thereof. In addition, as described above, in the exemplary embodiment, since tube 14 is wound on the outer periphery of cylindrical pipe 15, tube 14 contacts or is close to cylindrical pipe 15 as well. The liquid that flows in tube 14 is heated by absorbing the radiated light from lamp heater 16, which primarily transmits tube 14, while since tube 14 contacts or is close to reflection plate 13 and cylindrical pipe 15, the liquid may be heated by thermal conduction to tube 14 from reflection plate 13 and cylindrical shape 15. That is, according to the configuration of the exemplary embodiment, the liquid that flows in tube 14 is efficiently heated.

A temperature sensor 17 is attached to an outer peripheral surface of reflection plate 13. As temperature sensor 17, the temperature measurement resistor such as the platinum temperature measurement resistor or thermistor, or the thermocouple may be utilized. Temperature sensor 17 is electrically connected to a temperature controller 21.

Lamp heater 16 may be a mercury lamp or halogen lamp heater and is supported by jig 16*a* outside case 11. A power supply 22 is connected to an electrode 16*e* of lamp heater 16 (see FIG. 2) and lamp heater 16 is turned on by electric power from power supply 22, and the liquid that flows in tube 14 is heated by the radiated light. A breaker 23 is installed in a circuit constituted by lamp heater 16 and power supply 22, and breaker 23 is electrically connected with temperature controller 21. When the temperature of reflection plate 13 is higher than a predetermined reference temperature, a signal is outputted to breaker 23 from temperature controller 21, and breaker 23 to which the outputted signal is inputted interrupts supplying electric power to lamp heater 16 from power supply 22. As a result, as will be described below, cylindrical pipe 15 is prevented from being excessively heated.

In liquid heating unit 10 having the above-described configuration, the radiated light from lamp heater 16 transmits cylindrical pipe 15 made of quartz and transmits tube 14 made of PFA to be absorbed by the liquid that flows in tube 14. As a result, the liquid is heated. The temperature of the liquid is monitored by the temperature sensor installed at an outlet pipe 140 of tube 14, and the temperature of the liquid is controlled to a predetermined temperature by controlling the electric power supplied to lamp heater 16 from power supply 22. As a result, it is possible to supply the liquid heated at the predetermined temperature to a liquid processing apparatus connected with liquid heating unit 10.

Herein, when the radiated light transmits cylindrical pipe 15, quartz constituting cylindrical pipe 15 absorbs the radiated light even a little, and as a result, cylindrical pipe 15 is also heated. Since the temperature of lamp heater 16 itself reaches up to approximately 800° C. to 1000° C., cylindrical pipe 15 may also be heated up to the temperature or so. Since the heatproof temperature of quartz is approximately 1500° C., cylindrical pipe 15 is rarely deformed or broken by heat. However, since the melting point of PFA constituting tube 14 is approximately 315° C., when tube 14 is heated by cylindrical pipe 15 heated up to approximately 1000° C., tube 14 may be deformed or broken. Therefore, the temperature of tube 14 may be monitored in order to protect tube 14. However, it is difficult to accurately measure the temperature of tube 14 using the temperature sensor while the light is radiated from lamp heater 16 and transmitted permeated through tube 14. Likewise, it is difficult to accurately measure the temperature of cylindrical pipe 15 using the temperature sensor.

However, according to liquid heating unit 10 of the exemplary embodiment, the temperature of reflection plate 13 is measured by temperature sensor 17 attached to the outer peripheral surface of reflection plate 13 placed to surround tube 14, and the temperature of tube 14 and the temperature of cylindrical pipe 15 which can be heated to a higher temperature than that of tube 14 closer to the temperature of lamp heater 16 can be monitored. That is, by setting the reference temperature of temperature controller 21 to a temperature lower than the melting point of PFA by, for example, 10 to 30° C., supplying electric power to lamp heater 16 may be interrupted by breaker 23 when the temperature of reflection plate 13 is higher than the reference temperature. Accordingly, it is possible to prevent cylindrical pipe 15, particularly, tube 14 from being excessively heated.

Since the temperature of cylindrical pipe 15 which is installed more inside than tube 14 and closer to lamp heater 16 than tube 14 becomes higher than the temperature of tube 14 or reflection plate 13, the correlation between the temperature of cylindrical pipe 15 and the temperature of reflection plate 13 is acquired to determine the reference temperature based thereon. However, in the exemplary embodiment, since cylindrical pipe 15 is fabricated by quartz, it is difficult to measure the temperature of quartz-made cylindrical pipe 15 heated by the radiated light from lamp heater 16. Therefore, the correlation between the temperature of cylindrical pipe 15 and the temperature of reflection plate 13 may be acquired in advance by measuring the temperature of reflection plate 13 while heating the liquid that flows in tube 14 with lamp heater 16, turning off lamp heater 16 after the temperature is stabilized, measuring the temperature of cylindrical pipe 15 immediately after turning-off by using a temperature sensor installed in advance, and setting the measured temperature to the temperature of cylindrical pipe 15. Therefore, it is possible to identify whether the temperature of cylindrical pipe 15 which tends to be higher than the temperature of tube 14 reaches a temperature which is 10 to 30° C. lower than the melting point of PFA by monitoring the temperature of reflection plate 13 with temperature sensor attached to reflection plate 13.

Further, in liquid heating unit 10, since tube 14 is wound around cylindrical pipe 15, tube 14 is bent to contact lamp heater 16, such that lamp heater 16 is not broken. Further, even when liquid is leaked from tube 14, cylindrical pipe 15 is placed around lamp heater 16, and as a result, the leaked liquid does not spatter lamp heater 16, so that lamp heater 16 may be prevented from being broken.

Further, in liquid heating unit 10, since reflection plate 13 is installed to surround tube 14 in which liquid flows, the radiated light from lamp heater 16, which transmits tube 14 (alternatively, a gap thereof) is reflected on reflection plate 13 to be irradiated to tube 14, thereby heating liquid more efficiently.

First Modified Example of First Exemplary Embodiment

Figure 3:
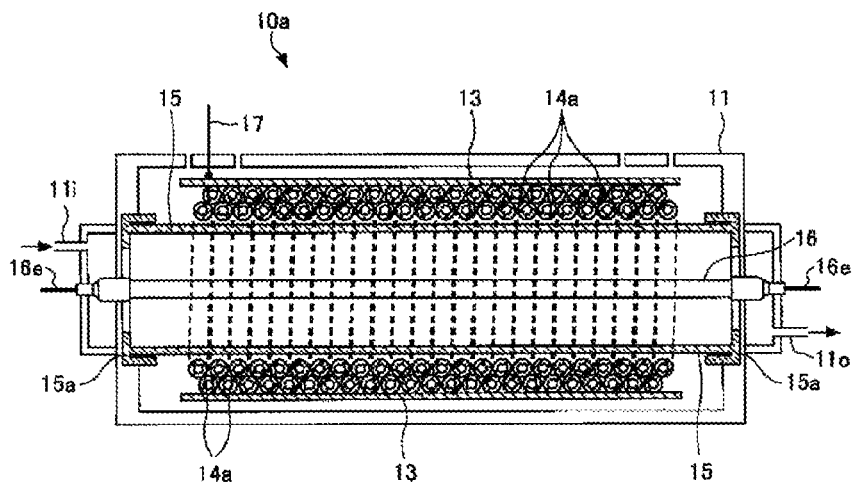
FIG. 3 is a cross-sectional view illustrating a liquid heating unit according to a first modified example of the first exemplary embodiment of the present disclosure.

Referring to FIG. 3, a first modified example of liquid heating unit 10 according to the first exemplary embodiment will be described. FIG. 3 is a cross-sectional view showing a liquid heating unit 10a of the first modified example. As shown in FIG. 3, liquid heating unit 10a is different from liquid heating unit 10 in that a tube 14a in which liquid flows is wound around cylindrical pipe 15 in a double spiral shape and substantially the same as liquid heating unit 10 in other configurations. When liquid having low absorption rate of radiated light from lamp heater 16 is used, it is easy to absorb the reflected light by using tube 14a wound in the double spiral shape, and as a result, the liquid can be efficiently heated.

Even in liquid heating unit 10a of the first modified example, the temperature of reflection plate 13 is measured by using temperature sensor 17 attached to the outer peripheral surface of reflection plate 13, and the temperatures of tube 14a and cylindrical pipe 15 can be monitored through the measurement. In addition, when the temperature of reflection plate 13 is higher than a predetermined reference temperature, supplying electric power to lamp heater 16 can be interrupted. That is, even by liquid heating unit 10a of the first modified example, the same effect as liquid heating unit 10 can be achieved.

Second Modified Example of First Exemplary Embodiment

Figure 4:
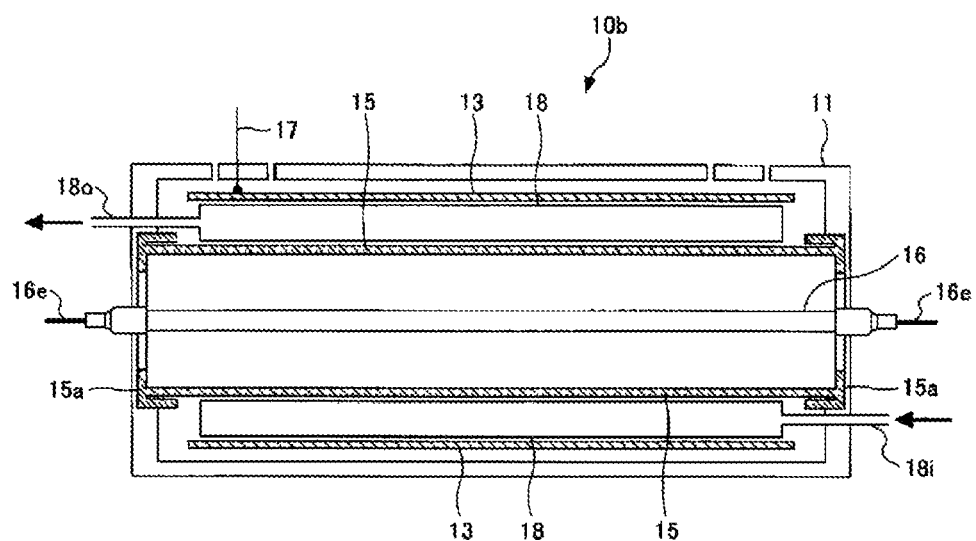
FIG. 4 is a cross-sectional view illustrating a liquid heating unit according to a second modified example of the first exemplary embodiment of the present disclosure.

Next, referring to FIG. 4, a second modified example of liquid heating unit 10 according to the first exemplary embodiment will be described. FIG. 4 is a cross-sectional view showing a liquid heating unit 10b of the second modified example. As shown in FIG. 4, liquid heating unit 10b includes a liquid tank 18 instead of tube 14 in liquid heating unit 10. Except for this, liquid heating unit 10b has substantially the same configuration as liquid heating unit 10. Liquid tank 18 has a double cylindrical pipe, which is sealed by the top surface and the bottom surface having a ring shape and, for example, liquid tank 18 is fabricated by PFA. Further, an inlet pipe 18i and an outlet pipe 18o for liquid are installed on the top surface and the bottom surface, respectively. Liquid flows into liquid tank 18 from inlet pipe 18i, is heated to a predetermined temperature by lamp heater 16 in liquid tank 18, and flows out from outlet pipe 18o. Cylindrical pipe 15 is inserted and penetrated in an internal space of liquid tank 18 and liquid tank 18 is held from the inside by cylindrical pipe 15.

Even in liquid heating unit 10b configured as described above, the temperature of reflection plate 13 is measured by using temperature sensor 17 attached to the outer peripheral surface of reflection plate 13, and the temperatures of liquid tank 18 and cylindrical pipe 15 can be monitored through the measurement. In addition, when the temperature of reflection plate 13 is higher than a predetermined reference temperature, supplying electric power to lamp heater 16 can be interrupted. That is, even by liquid heating unit 10b of the second modified example, the same effect as liquid heating unit 10 can be achieved.

Second Exemplary Embodiment

Figure 5:
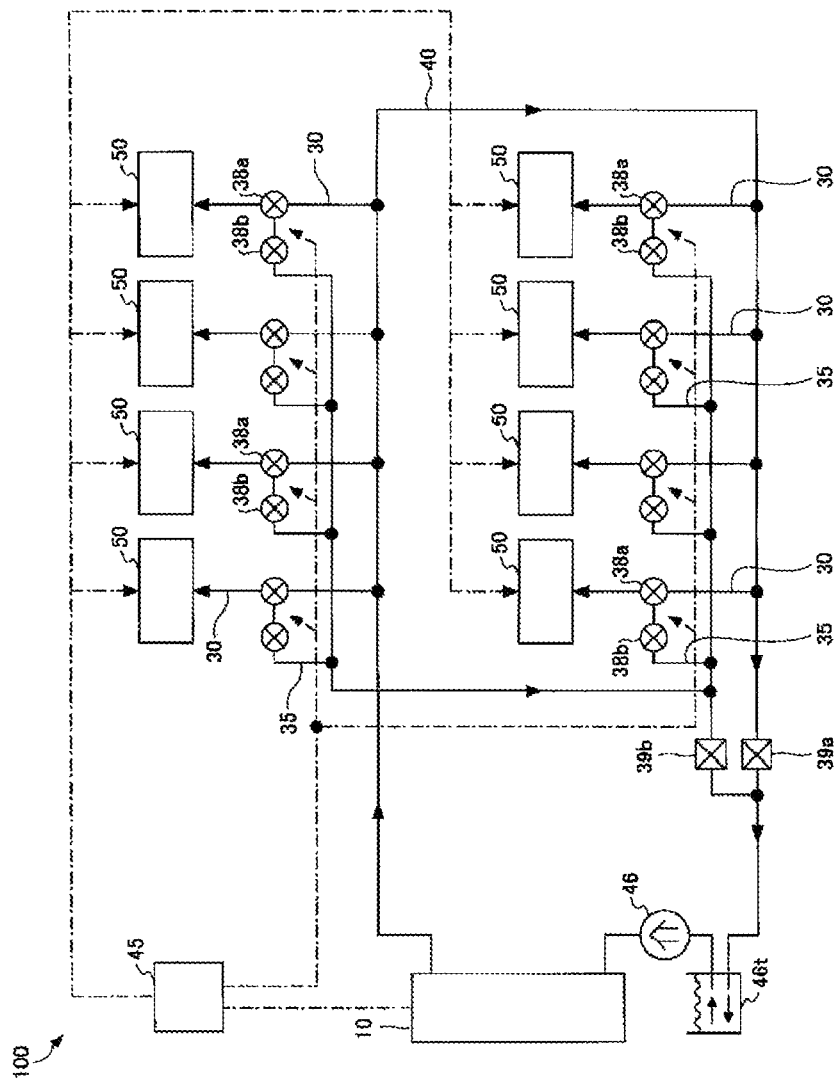
FIG. 5 is a mimetic view illustrating a liquid processing apparatus according to a second exemplary embodiment of the present disclosure.

Continuously, referring to FIGS. 5 and 6, a liquid processing apparatus according to a second exemplary embodiment of the present disclosure will be described. As shown in FIG. 5, a liquid processing apparatus 100 according to the exemplary embodiment includes liquid heating unit 10 according to the first exemplary embodiment, a circulation line 40 forming a closed liquid passage together with tube 14 (see FIG. 1 or 2) of liquid heating unit 10, a pump 46 installed in the middle of circulation line 40 and circulating liquid in liquid heating unit 10 and circulation line 40, and a storage tank 46t installed upstream of pump 46. Further, liquid processing apparatus 100 includes a plurality of supply lines 30 branched from circulation line 40, a plurality of liquid processing units 50 installed to correspond to the plurality of supply lines 30 and connected with each of supply lines 30, and a plurality of return lines 35 branched from the plurality of supply lines 30, respectively, through a 3-way valve 38a. An opening/closing valve 38b is installed on each of return lines 35 to be adjacent to 3-way valve 38a.

Further, the respective return lines 35 are joined to each other to connect to circulation line 40 upstream of pump 46. A first relief valve 39b is installed upstream of the joint point, while a second relief valve 39a is installed on circulation line 40 upstream of the joint point. The pressure of liquid in return line 35 is controlled to be lower than that of liquid in circulation line 40 by first and second relief valves 39b and 39a. Further, by installing a heat insulation member on circulation line 40, supply line 30, and return line 35, temperature drop of liquid that flows on the lines may be reduced.

3-way valve 38a is switched to selectively form a first passage in which liquid flows from circulation line 40 to liquid processing unit 50 and a second passage in which liquid flows from circulation line 40 to return line 35. Further, opening/closing valve 38b is closed when 3-way valve 38a forms the first passage and opened when 3-way valve 38a forms the second passage. As described above, 3-way valve 38a and opening/closing valve 38b cooperate with each other, such that liquid is supplied from circulation line 40 to liquid processing unit 50 through supply line 30 to be used in liquid processing and when liquid processing is not performed in liquid processing unit 50, liquid returns to circulation line 40 from supply line 30 via return line 35 again.

Figure 6A:
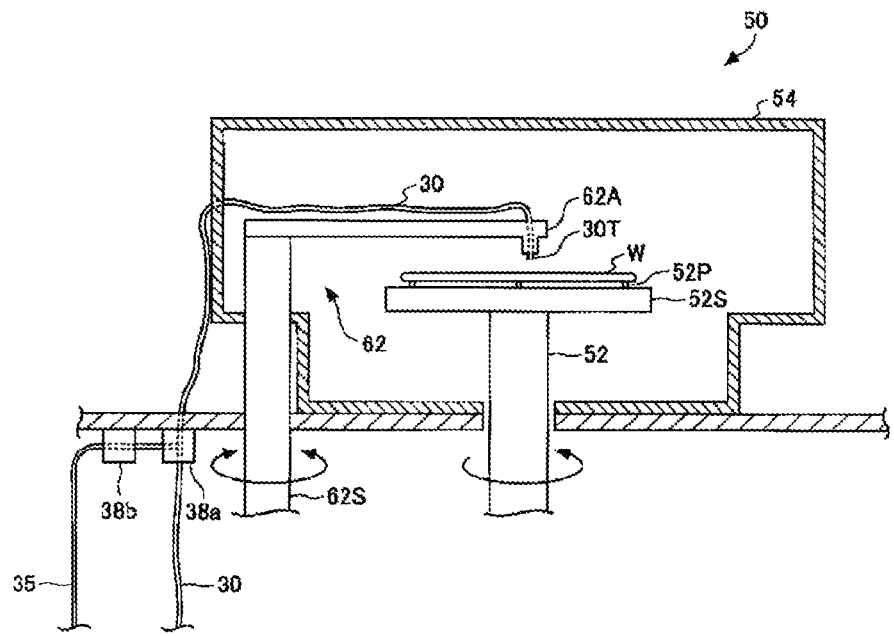
FIG. 6 is an explanatory diagram of a liquid processing unit included in the liquid processing apparatus of FIG. 5.

Liquid processing unit 50 may be, for example, a single wafer type cleaning unit as shown in FIG. 6A. In the example shown in the figure, liquid processing unit 50 includes a susceptor 52S holding and rotating a wafer W to be processed, a dispenser 62 supplying liquid to wafer W supported on susceptor 52S through a support pin 52P, and a case 54 housing susceptor 52S and dispenser 62.

Figure 6B:
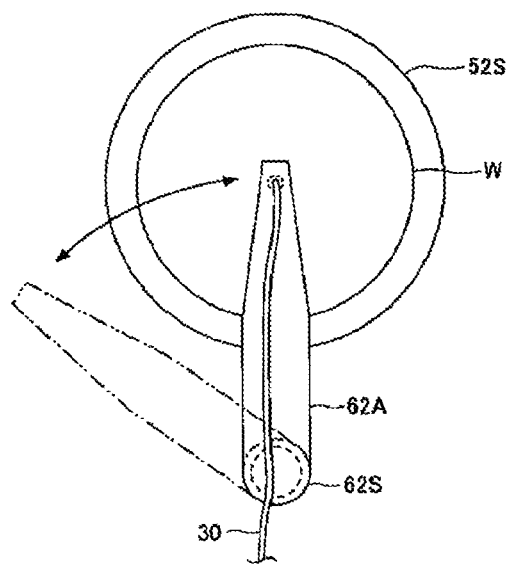

Dispenser 62 includes an arm 62A extending substantially in a horizontal direction and a shaft 62S holding and rotating arm 62A. If shaft 62S is rotated by a driving mechanism (not shown), arm 62A may move between a first position located at substantially upper center of wafer W on susceptor 52S and a second position located at the upper outside which is more outside susceptor 52S, as shown in FIG. 6B. A through-hole is formed at a front end of arm 62A and a discharge portion 30T of supply line 30 branched from circulation line 40 is coupled to the through-hole.

When arm 62A moves to the first position, 3-way valve 38a and opening/closing valve 38b form the first passage and liquid is supplied toward wafer W from discharge portion 30T of supply line 30. In this case, wafer W is being rotated by susceptor 52S and liquid supplied to wafer W flows toward the outside on the surface of wafer W by centrifugal force generated by the rotation. The surface of wafer W is washed by the flow and solubility of the liquid.

Referring back to FIG. 5, liquid processing apparatus 100 includes a control unit 45 controlling the constituent components or members of liquid processing apparatus 100, such as liquid processing unit 50, 3-way valve 38a, and opening/closing valve 38b. Further, control unit 45 is electrically connected with the temperature sensor inserted into outlet pipe 14o (see FIG. 1) of tube 14 of liquid processing unit 10, and monitors the temperature (that is, a temperature at an outlet of liquid heating unit 10) of liquid that flows in tube 14. When this temperature becomes lower than a temperature required for processing in liquid processing unit 50, control unit 45 stops the operation of liquid processing unit 50 and controls 3-way valve 38a and opening/closing valve 38b to form the second passage (circulation line 40→supply line 30→return line 35). As a result, it is possible to prevent wafer W from being processed (washed) with a low processing efficiency.

Control unit 45 may determine whether the operation of liquid processing unit 50 is continued or stopped only by the temperature at the outlet of liquid heating unit 10. That is, the temperature of liquid in liquid heating unit 10 is controlled by the temperature sensor (not shown) of outlet pipe 14o of tube 14 of liquid heating unit 10, temperature controller 21, lamp heater 16, and power supply 22. Further, when the temperature of reflection plate 13 measured by temperature sensor 17 of liquid heating unit 10 is higher than a reference temperature, supplying electric power to lamp heater 16 is interrupted, but the interruption is also controlled in liquid heating unit 10. Therefore, even when supplying electric power to lamp heater 16 of liquid heating unit 10 is interrupted, liquid processing unit 50 may be continuously operated when the temperature of liquid at the outlet of liquid heating unit 10 is within the range of the temperature required for processing in liquid processing unit 50. Further, while the temperature of liquid at the outlet of liquid heating unit 10 is maintained within the range of the temperature required for processing in liquid processing unit 50, the temperature of reflection plate 13 of liquid heating unit 10 is measured and even when it is judged that the temperature is lower than the reference temperature, supplying electric power to lamp heater 16 can restart, such that the processing in liquid processing unit 50 can be continuously performed.

While the temperature of liquid at the outlet of liquid heating unit 10 is maintained within the range of the temperature required for processing in liquid processing unit 50, the temperature of reflection plate 13 of liquid heating unit 10 is measured and when the temperature is lower than the reference temperature, supplying electric power to lamp heater 16 does not restart immediately at the time of becoming the low temperature, and supplying electric power to lamp heater 16 may restart at the time of determining that the temperature of liquid at the outlet of liquid heating unit 10 becomes a temperature higher than (alternatively, lower than) a lower limit value of the range of the temperature required for processing in liquid processing unit 50 by a predetermined amount of temperature. The predetermined amount of temperature in this case may be, for example, in the range of 1 to 5° C.

Further, the temperature of liquid is not limited to be measured only at the outlet of liquid heating unit 10, but may be measured at an inlet of liquid heating unit 10, and further, may be measured at a predetermined position in tube 14.

Although not shown in the figure, in liquid processing apparatus 100, a supplementing line for supplementing liquid consumed in liquid processing unit 50 may be connected to circulation line 40. The supplementing line may be installed for storage tank 46t. Further, a buffer tank is installed on circulation line 40 and the filling line may be connected thereto. By this configuration, it is possible to prevent the temperature of liquid from being dropped, even though liquid at a room temperature or so is supplemented through the filling line.

Next, appropriately referring to FIGS. 1 and 5, an operation (liquid processing method) of liquid processing apparatus 100 configured as above will be described.

First, by activating pump 46, liquid is circulated in tube 14 of liquid heating unit 10 and circulation line 40. Power is supplied to lamp heater 16 of liquid heating unit 10 from power supply 22, and lamp heater 16 is turned on to generate radiated light. The radiated light transmits cylindrical pipe 15 and tube 14 to be absorbed in liquid that flows in tube 14, and as a result, liquid is heated. The temperature of the heated liquid is measured by a temperature sensor (not shown) installed at outlet pipe 14o (see FIG. 1 or 2) of tube 14. Power supply 22 is controlled based on the measurement result, and the temperature of liquid is maintained to a temperature higher than a predetermined temperature, that is, the temperature required for the processing performed in liquid processing unit 50. In the meantime, 3-way valve 38a and opening/closing valve 38b of liquid processing apparatus 100 form a passage (second passage) to return to circulation line 40 from circulation line 40 via supply line 30 and return line 35, and some of liquid that flows on circulation line 40 flows on the second passage.

After it is verified that the temperature of liquid is maintained to the predetermined temperature, 3-way valve 38a and opening/closing valve 38b are controlled by control unit 45 at a predetermined timing and liquid is supplied to liquid processing unit 50. In liquid processing unit 50, arm 62A of dispenser 62 moves to substantially upper center of wafer W maintained on susceptor 52 through support pin 52P under the control by control unit 45, and liquid is supplied to wafer W from front end 30T to process (wash) wafer W. When the processing (cleaning) in liquid processing unit 50 is completed, 3-way valve 38a and opening/closing valve 38b are switched to allow liquid to flows on the second passage, and as a result, supplying liquid to liquid processing unit 50 is stopped. In addition, if wafer W processed in liquid processing unit 50 is carried out and a next wafer W is carried in, the processing (cleaning) starts again. Following these procedures, wafer W is processed in liquid processing apparatus 100.

While the wafer is being processed with the liquid in liquid heating unit 10, the temperature of tube 14 and/or cylindrical pipe 15 is being monitored through measurement of the temperature of reflection plate 13, and when the temperature of reflection plate 13 is higher than the reference temperature, supplying electric power to lamp heater 16 is interrupted by breaker 23. Even when the supplying electric power is interrupted, the liquid processing in liquid processing apparatus 100 is continued without stopping while the temperature of liquid is maintained at the predetermined temperature or more, and the operation of liquid processing unit 50 stops at the time when the temperature of liquid is lower than the predetermined temperature.

As described above, although the present disclosure has been described with reference to several exemplary embodiments, the present disclosure is not limited to the disclosed exemplary embodiments but may be modified and changed variously according to the appended claims.

For example, liquid processing apparatus 100 according to the second exemplary embodiment may include liquid heating units 10a and 10b instead of liquid heating unit 10. Further, liquid processing unit 50 in liquid processing apparatus 100 is not limited to the single wafer type cleaning unit, but may be a batch-type cleaning tank. In addition, the liquid that is heated by the liquid heating unit for processing the wafer according to the exemplary embodiment of the present disclosure is not limited to IPA or DIW, but may be the liquid that is used to dry the wafer or a chemical liquid heated and used in a manufacturing process of a semiconductor or a flat panel display (FPD). Further, wafer W as an object to be processed is not limited to a semiconductor wafer, but may be a glass substrate for the FPD.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid heating unit, comprising:
a lamp heater configured to radiate light;
a cylindrical member made of material transmitting the having a cylindrical shape in which the lamp heater is able to be inserted and penetrated into an internal space thereof;
a liquid pipe placed along an outer periphery of the cylindrical member and configured to heat liquid flowing therein using the radiated light;
a reflection plate configured to cover the liquid pipe conduction part from the outside and reflect the radiated light; and
a first temperature sensor attached to an outer surface of the reflection plate.

2. The liquid heating unit of claim 1, wherein the liquid pipe has a melting point lower than heat resistant temperature of the cylindrical member and transmittance with respect to the radiated light higher than the transmittance of the cylindrical member.

3. The liquid heating unit of claim 1, wherein the liquid pipe is a tube made of tetrafluoroethylene perfluoro alkyl vinyl ether copolymer (PFA), which is wound around the outer periphery of cylindrical member in a spiral shape.

4. The liquid heating unit of claim 1, further comprising:
a temperature controller electrically connected with the first temperature sensor,
wherein the temperature controller generates a signal when the temperature of the reflection plate measured by the first temperature sensor is higher than a predetermined reference temperature.

5. The liquid heating unit of claim 4, further comprising a breaker installed on a power supply line supplying electric power to the lamp heater, inputting the signal, and interrupting power supplied to the lamp heater.

6. The liquid heating unit of claim 1, further comprising a second temperature sensor installed in the liquid pipe and configured to measure the temperature of the liquid heated by the radiated light.

7. A liquid processing apparatus, comprising:
a liquid heating unit according to claim 1;
a main supply line connected with the liquid pipe of the liquid heating unit;
a supply line branched from the main supply line; and
a liquid processing unit connected with the supply line and configured to process an object to be processed using the liquid supplied from the supply line.

8. The liquid processing apparatus of claim 7, further comprising a control unit configured to determine whether the temperature of the liquid heated by the liquid heating unit is within the range of a temperature required for processing in the liquid processing unit.

9. A liquid processing apparatus, comprising:
a liquid heating unit according to claim 5;
a main supply line connected with the liquid pipe of the liquid heating unit;
a supply line branched from the main supply line; and
a liquid processing unit connected with the supply line and configured to process an object to be processed using the liquid supplied from the supply line,
wherein even when the temperature of the reflection plate measured by the first temperature sensor exceeds a predetermined reference temperature and supply of the electric power to the lamp heater is interrupted by the breaker, the operation of the liquid processing unit continues when the control unit determines that the temperature of the liquid heated by the liquid heating unit is within the range of a temperature required for processing in the liquid processing unit.

10. A liquid processing method using a liquid heating unit that includes a lamp heater configured to radiate light, a cylindrical member made of material transmitting the light and having a cylindrical shape in which the lamp heater is able to be inserted and penetrated into an internal space thereof, a liquid pipe placed along an outer periphery of the cylindrical member and configured to heat liquid flowing therein using the radiated light, a reflection plate configured to cover the liquid pipe from the outside and reflect the radiated light, and a first temperature sensor attached to an outer surface of the reflection plate, the method comprising:
supplying liquid to be used for processing an object to be processed to the liquid heating unit, thereby heating the liquid to a predetermined temperature;
measuring the temperature of the liquid heated to the predetermined temperature by the liquid heating unit; and
supplying the liquid heated to the predetermined temperature by the liquid heating unit to a liquid processing unit for processing the object to be processed.

11. The method of claim 10, further comprising continuing the operation of the liquid processing unit when a control unit determines that the temperature of the liquid heated by the liquid heating unit is within a range of temperature required for processing in the liquid processing unit, even though the temperature of the reflection plate measured by the first temperature sensor is higher than a predetermined reference temperature.

12. The method of claim 10, further comprising interrupting supply of electric power to the lamp heater when the temperature of the reflection plate in the liquid heating unit is higher than a predetermined reference temperature.

13. The method of claim 12, further comprising:
after the interrupting,
measuring the temperature of the reflection plate by the first temperature sensor;
determining whether the temperature of the reflection plate measured in the measuring step is lower than the predetermined reference temperature; and
restarting the supply of the electric power to the lamp heater when it is determined that the temperature of the reflection plate is lower than the predetermined reference temperature in the determining step.

14. The method of claim 12, further comprising:

after the interrupting, measuring the temperature of the reflection plate by the first temperature sensor;

a first determining whether the temperature measured in the measuring of the temperature of the reflection plate is equal to or lower than the predetermined reference temperature;

a second determining whether the temperature of the liquid heated by the liquid heating unit is equal to or lower than a temperature which is higher than the lower limit value of the range of a temperature required for processing in the liquid processing unit by a predetermined amount of temperature, when it is determined that the temperature measured in the first determining is equal to or lower than the predetermined reference temperature; and restarting the supply of the electrical power to the lamp heater of the liquid heating unit when it is determined that the temperature of the liquid in the second determining is equal to or lower than the higher temperature by the predetermined amount of temperature.

* * * * *